Dec. 8, 1970 D. J. BARCHOK 3,546,492

TRANSISTOR SWITCHING CIRCUIT

Filed Oct. 10, 1967

OPTIMUM L.
NO L.
$I_{B_2}$ STOPS BEFORE $I_C$ FALLS TO ZERO.

INVENTOR.
Donald J. Barchok
BY Nicholas A. Camasto
ATTY.

3,546,492
TRANSISTOR SWITCHING CIRCUIT
Donald J. Barchok, Chicago, Ill., assignor to Admiral Corporation, Chicago, Ill., a corporation of Delaware
Filed Oct. 10, 1967, Ser. No. 674,237
Int. Cl. H03k 3/26
U.S. Cl. 307—300 7 Claims

ABSTRACT OF THE DISCLOSURE

A circuit arrangement for speeding up the actual switching time of a transistor including an inductance in series with the drive pulse source and the base-emitter junction of the transistor. The inductance controls the flow of base current during switching so that reverse base current flows over the entire period of collector current decay.

Figure 1:
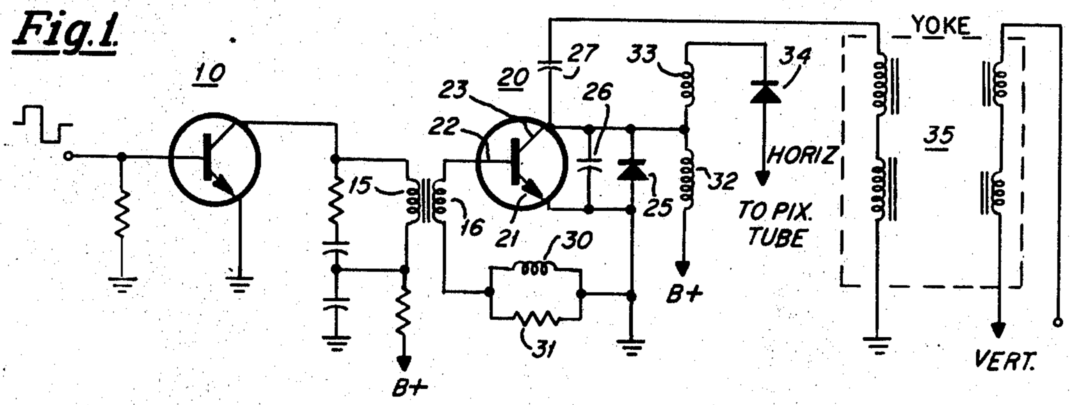

This invention is concerned with transistor switching times and, in particular, with switching times of transistors used in the horizontal output stages of television receivers. During the inevitable transistorization of television receivers utilizing vacuum tubes, it was recognized that certain functions would present problems far greater than those normally encountered in audio and small signal circuits. In particular, that of developing the deflection currents for the television receiver imposed stringent requirements on transistor characteristics and circuit design. A major problem has been to preclude the likelihood of breakdown of the semiconductor junctions of the transistors due to overheating, voltage punch through, etc., without necessitating extremely rigid and uneconomical transistor tolerances.

The art of transistor manufacture is rapidly approaching a high level of refinement. Similarly, the mechanics of semiconductor charge movement, barriers, storage times and the like are being constantly studied, and physical explanations of the empirically observable phenomena set forth. However, there is much that is unexplained in transistor operation, and consequently, many observable results are as yet only explainable on the basis of hypotheses. Recognizing that our knowledge of semiconductor physics is growing constantly, it will be understood that any particular theory advanced by way of explanation of the invention is not to be considered conclusive. Rather, the invention will be described empirically and any theories advanced in support of the observed phenomena are solely for simplifying an understanding of these phenomena.

A major problem in transistor switching circuits occurs during actual switching, that is when the collector current is rapidly falling and the collector voltage rapidly rising. It is this problem to which the present invention is directed.

In the art, the terms "storage time" and "fall time" are generally used in specifying transistor parameters. "Storage time" is the time interval between base current reversal (below zero level) until the collector current has declined 10%. "Fall time" is that time required for the collector current to decline from its 90% value to its 10% value. For the purposes of explanation of this invention, the area of interest is the entire interval from the beginning of the switching operation, that is when the collector current just begins to decline, to the point when the collector current actually reaches zero.

This interval will be called the "cutoff time" for the collector current.

The slope of collector voltage rise is primarily a function of the connected load on the transistor. For practical purposes, this slope of collector voltage is relatively unchanged with the circuit of the invention and need be considered in our discussions only to the extent that it is an indispensable element in the switching problem. The crux of the problem lies in the fact that the transistor collector current is switched so slowly that a substantial "overlap" period exists during which the transistor collector voltage and current are relatively large. This condition leads to excessive junction heating, and the transistor performs as a relatively poor switch. During the actual circuit design of a horizontal output stage, a large number of transistors experienced thermal runaway and ultimate destruction as a result of excessive heating during switching.

The classical solution of increasing the reverse base current, i.e., driving the transistor harder into cutoff, did not significantly affect the problem. The conventional base "speed up" capacitor was also tried with somewhat better results, although the large parallel resistance required across the capacitor added considerably to the base power requirements. The solution surprisingly was that of tailoring the base current so that reverse base current would flow for the entire "cutoff time" of the collector current. It was found that, when this condition prevailed, the collector current "cutoff time" was optimum (shortest) for the given transistor, and consequently, the period of simultaneously existing large collector current and collector voltage was minimized. Using this technique results in a small delay in initiating switching (appears as an addition to "storage time"), but of such slight duration as to be unobjectionable. In accordance with the invention, it was found that the simple addition of an inductive element in series with the driving pulse source and the transistor base-emitter junction proved a complete solution of the problem.

Accordingly, a principal object of this invention is to provide an improved switching transistor circuit arrangement.

A further object of this invention is to provide a method for determining the optimum operating conditions for a switching transistor.

Another object of this invention is to provide a switching transistor circuit arrangement utilizing a small inductive element in the transistor input circuit to control the flow of base current thereto during switching.

A still further object of this invention is to provide a method of visually determining the optimum operating conditions of a switching transistor which method employs the use of an adjustable inductance element and an oscilloscope.

Figure 2A:
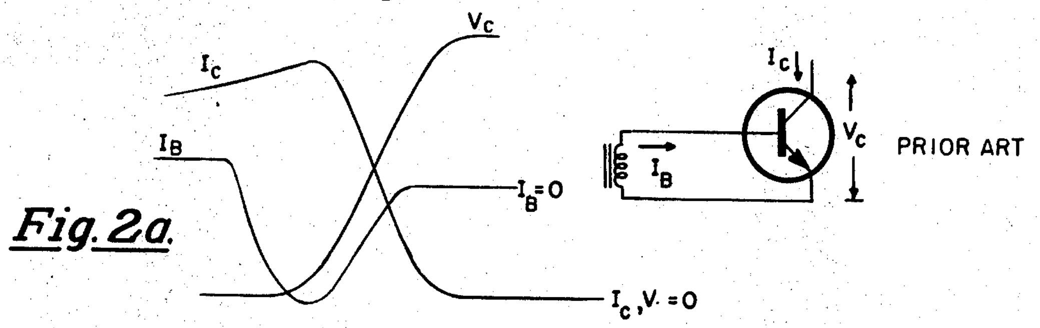
Figure 2B:
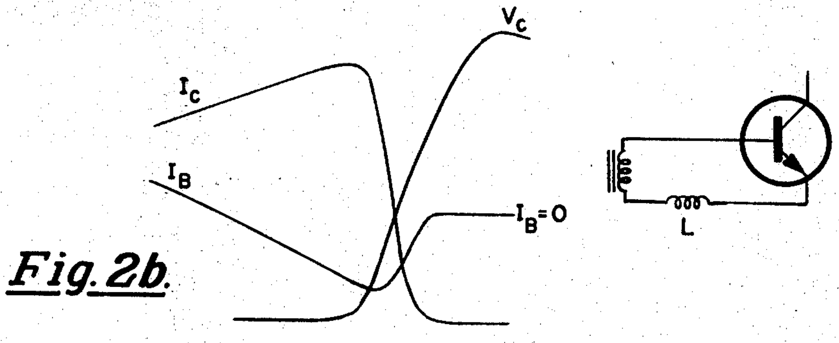
Figure 2C:
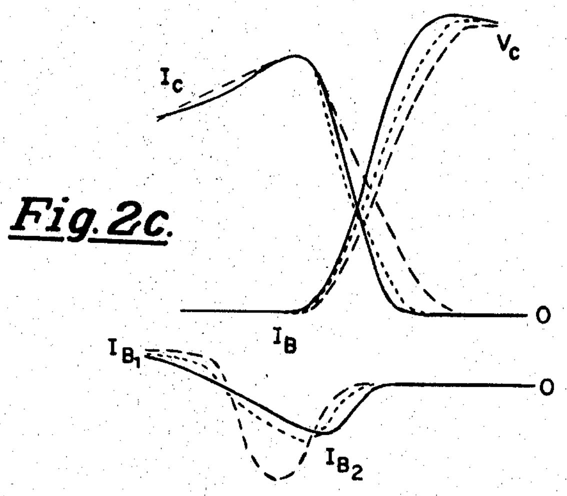

Other objects and features of this invention will become apparent upon a reading of the following specification in conjunction with the drawings in which:

FIG. 1 is a partial, schematic diagram of a television horizontal deflection circuit utilizing a switching transistor incorporating the circuit of the invention; and FIGS. 2a–2c represent graphical portrayals of circuit switching conditions with which the invention is concerned.

Referring now to FIG. 1, there is shown a driver transistor 10 which has a base input circuit supplied with a substantially square wave voltage for switching.

The output load of transistor 10 includes the primary winding 15 of a driver transformer. The driver transformer has a secondary winding 16 connected in series with the base-emitter circuit of output transistor 20.

The output transistor, in this environment supplying the horizontal deflection power for a television receiver, has an emitter electrode 21, a base electrode 22, and a collector electrode 23. Collector 23 is supplied operating potential from a source of B+ voltage through a portion 32 of a conventional autotransformer. A coupling capacitor 27 is connected from collector 23 to a yoke 35 conventionally mounted on the neck of the picture tube, not shown. The yoke is responsible for developing the necessary magnetic fields for scanning the electron beam over the face of the picture tube screen. As shown in the drawing, one pair of yoke deflection coils are connected to the horizontal output circuit and another pair to a vertical output circuit (not shown). A damper diode 25 is connected across the collector and emitter electrodes of transistor 20 and performs the conventional function in the reaction-scan process of rectifying the ringing pulse produced upon collapse of the yoke field and producing a portion of the scanning current for yoke 35. The capacitor 26 is used for tuning purposes, also well-known in the art. A high voltage developing winding 33 of the autotransformer is connected to a high voltage rectifier diode 34, which as indicated, is connected to the picture tube, not shown.

In prior art circuits, secondary winding 16 would be generally connected to emitter 21 directly. However, in the instant circuit, an inductor 30, parallelled by a resistor 31, is serially interposed between winding 16 and emitter 21 for purposes which will be explained shortly. Resistor 31 is included for damping purposes and should not be considered necessary in practicing the invention.

In operation, the square wave voltage input to driver transistor 10 results in switching voltage being developed at the base of horizontal output transistor 20 which, in accordance with well-known techniques, further results in large voltage pulses in the output circuit of transistor 20 due to the reaction-scan deflection system. The pulse voltages occur across the essentially inductive yoke circuit and a saw-tooth current essential for linear deflection of the electron beam across the picture tube screen occurs when transistor 20 is in a saturated state.

In transistor switching circuits (which generally involve a transistor being driven from a saturated condition to a cutoff condition and vice versa), finite times are required between the drive signal change and the transistor response. These time intervals or delays should not be confused with normal time constants of circuitry coupled to the transistor, but represent delays inherent in the device itself. In other words, the transistor does not react instantaneously to input signal or driving signal changes. It is also known that a transistor in heavy saturation requires a longer time to switch into cutoff than one which is lightly in saturation. As alluded to briefly above, various terms have been developed to describe these different characteristics, among the most important of which is "storage time," also defined as that time required for stored minority charge to become zero, "fall time" and "delay time."

In general, the switching time for a transistor being turned on comprises a "delay time" due to charging of the transistor's inherent capacitances plus a "rise time," generally determined by the load circuit connected thereto. The "delay time" is characteristically defined as the time required for the collector current ($I_c$) to reach 10% of its steady state value and the "rise time," that required for $I_c$ to go from its 10% value to a 90% value. Conversely, the off time of the transistor is defined as a combination of "storage time" and "fall time," previously discussed. The storage time is generally believed to be due to an excess of minority carriers in the base junction region of the transistor which must be removed before the junction becomes normally responsive. The fall time, like the rise time, is defined as that interval required for the collector current to decline from its 90% value to 10% of its steady state value.

In transistors, it is essential to establish a base charge (that is, an excess of minority carriers in the region of the base-emitter junction), in order to establish a collector current. In fact, the collector current is not only determined by the excess minority carriers comprising the base charge, but actually equals this excess charge. Normally, the excess minority carriers are injected into the emitter and diffuse across the base-emitter junction. Upon reaching the emitter-collector junction, they become the collector current. Thus, the collector current is substantially equal to the emitter current excepting a small percentage of these minority carriers lost in the base region.

Thus, it becomes clear that if a collector current is to be established, a base charge must be established and likewise, if the collector current is to be terminated, this base charge must be removed. The magnitude of the base charge is, of course, a function of the degree of satura- of the transistor. Thus, it also seems obvious that a heavily saturated transistor would be more difficult to turn off (more excess base charge to be removed) than a lightly saturated transistor.

Conventionally, "storage time" is that time required to remove these excess base chasges whereas "delay time" is the time to establish the excess base charge. Following this, it would appear that the storage time could be reduced by heavily reverse biasing the transistor and this, in general, is true. However, it has been found that "storage time," as defined, does not yield a true picture of what is occurring within the thansistor. The period after "storage time" which includes and extends beyond "fall time" and which might loosely be considered a transition time before the transistor is actually cut off, is the critical period in heavy current switching applications. It is during this period that simultaneously occurring collector currents and potentials cause excessive heating of the junction. Merely increasing the reverse drive has little effect on this period.

In FIG. 2*a*, there is graphically portrayed curves of collector current, collector voltage, and base current of a typical switching transistor driving an inductive load. These curves are generally indicative of the prior art and are appropriately labelled. The indicated quantities are shown on the small schematic representation of the circuit at the right of the graphs in FIGS. 2*a* and 2*b*. A full period of operation is not shown, but merely an expanded view of the critical portion of the cycle, namely that occurring during switching of the transistor from a saturated to a cutoff condition. As shown, the collector current is generally increasing when the base drive current is reversed. This corresponds to the saturated transistor being heavily reverse biased. The curves indicate the fall of collector current and the simultaneous rise of collector voltage, with the dotted area showing the overlap period, that is the period when the junction is dissipating an abnormal amount of power. It will be noted that for FIG. 2*a*, a relatively long period exists when sizeable collector current and collector voltages are present. This corresponds to a circuit where the base-emitter junction of the transistor is directly connected across the driving the transformer secondary.

In FIG. 2*b*, a similar set of curves is shown for a circuit identical to that used in FIG. 2*a* with the exception of an inductive element being inserted between the base-emitter junction and the driving source. The inductance exerts a control on the base current as shown and substantially precludes the rapid change thereof. Hence, instead of the base junction being heavily reverse biased in a rapid manner the base junction is subjected to a slowly diminishing current which gradually reverses as shown. This type of switch yields the surprising result of delaying somewhat the beginning of the collector current decline, but causing an accelerated decline thereof once the decline begins. The period of overlap between the collector current and collector voltage is seen to have been materially diminished due to the rapid decline of collector current, and consequently, the transistor junction dissipates a much smaller amount of energy than in the previous example.

In the embodiment shown, the forward base current fall and reverse base current rise is controlled by the inductive reactance in series with the base. Although the forward base current is reduced slowly to zero, there is little effect on the rising collector current. This indicates an excess of minority carriers in the base region which are supplying collector current during base current fall. Since carriers are being depleted during the base fall interval, the device is better prepared to be turned off at base current reversal.

In the case where the base current is reversed rapidly and at greater magnitude, the collector current cutoff time is appreciably greater. This slower cutoff is the result of what in the art has been termed "trapped carriers." These carriers apparently are not close enough to the base-emitter field to be sufficiently attached and hence removed, and only can be depleted by recombination, which is a relatively slow process. By delaying and slowing down reverse base current, and causing it to flow during the entire cutoff time, these carriers are acted upon for a longer time which therefore results in an appreciable speedup of collector current cutoff.

In FIG. 2*c*, there is shown an overlay of the curves of FIGS. 2*a* and 2*b* as well as an additional set of dotted curves covering an intermediate condition. The curves have been displaced in time slightly to initiate collector current decline at approximately the same time for readily comparison of the $I_c$ slopes. In this figure, a solid line indicates the current circuit with the inductance being optimized for minimum collector current cutoff time. The dashed line indicates the circuit previously discussed with reference to FIG. 2*a* where no inductance is included. The dotted curves display conditions where the reverse current $I_{B2}$ is caused to flow for a longer period of time than that shown in FIG. 2*a*, but for a shorter period of time than that shown in FIG. 2*b*. Noting the respective areas of overlap of collector current and collector voltage, it will be readily perceived that the optimum switching of the transistor is obtained when the reverse base current $I_{B2}$ is caused to flow for the full period of collector current cutoff. It has further been found that increasing the value of the inductance beyond the optimum point does not shorten the collector current "cutoff time," but merely slows down the entire switching operation. If the inductance is made too large, it will be found that the transistor begins to come out of saturation prior to switching, which is not acceptable.

While, no doubt, the optimum value of inductance required for any given circuit configuration may be calculated from a full knowledge of all parameters involved, by far a much simpler, yet highly effective method is to employ a variable inductance and note the resulting switching waveforms on an oscilloscope. It is a relatively simple matter of adjusting the inductance to a value satisfying the criterion of maintaining reverse base current flow for substantially the full period of collector current cutoff. Thereafter, the inductance value may be measured and this value inserted in production circuits without the need for further adjustment. Thus, while a novel circuit has been disclosed, it should also be recogized that a relatively simple method of empirically determining the optimum conditions for operating the switching transistor is also disclosed.

It is to be understood that the above description of a preferred embodiment of this invention is given by way of example only and that numerous modifications may be made without departing from the scope of this invention as claimed in the following claims.

The embodiments of the invention in which an exclusive property or privilege is claimed are defined as follows:

1. In combination; a transistor having an input circuit including a semiconductor junction and an output circuit; means supplying operating potentials to said transistor; a source of input switching voltage connected to said input circuit and characterized by a first portion forward biasing said semiconductor junction and a second portion reverse biasing said semiconductor junction; said transistor having an output circuit current cutoff delay time resulting from the effect of stored charge in the region of said semiconductor junction and, consequently, experiencing an output circuit current decline and voltage rise of respective magnitudes increasing the power dissipation of said transistor during switching; and means including a series connected inductor said input circuit minimizing the effect of said stored charge whereby the slope of the output current decline is increased to preclude the simultaneous occurrence of output voltage and output current of excessive magnitude.

2. The combination set forth in claim 1, wherein said last mentioned means maintains reverse current flow through said semiconductor junction during said second portion of said switching voltage substantially during the period required for said output circuit current to fall to zero.

3. The combination as set forth in claim 1, wherein the inductive reactance of said series connected inductor resists any abrupt change from said first portion to said second portion of said switching voltage, thereby gradually diminishing the flow of forward conduction current through semiconductor junction and providing for the flow of reverse current through said semiconductor junction substantially over the entire period of output current decline.

4. The combination as set forth in claim 3, wherein said serially connected inductor in circuit with said semiconductor junction, has a value approximating that value which produces the shortest total decline time for the output current of said transistor.

5. The method of optimizing operating parameters of a switching transistor designed to be driven heavily into collector current saturation and rapidly into collector current cutoff by minimizing the cutoff time of the collector current comprising the steps of: providing an inductive impedance element in series with the emitter-base junction of said transistor; and selecting a value for said inductive impedance element which permits reverse base current flow through said junction substantially for the period of time during which the collector current flows when being driven into cutoff.

6. The method of claim 5 including the additional steps of: providing a switching voltage having a first portion heavily biasing the emitter-base junction of said transistor to produce collector current saturation and a second portion rapidly reverse biasing the base-emitter junction of said transistor; providing a variable inductance in series with said switching voltage and said base-emitter junction; and adjusting said variable inductance to produce a reverse base-current in said transistor which flows substantially for the period of time during which said collector current flows when said transistor is switched into cutoff.

7. In combination; a transistor having an input circuit including a base-emitter semiconductor junction and an output circuit; means supplying operating potentials for said transistor; a source of input switching voltage connected across said emitter-base junction and characterized by a first portion heavily forward biasing said junction to produce a state of saturation in said transistor and a second portion reverse biasing said junction into cutoff;

said transistor having a collector current cutoff time and a collector voltage rise time of respective magnitudes producing excessive power dissipation in said transistor during switching due to the effect of stored charges in the region of said junction; and inductive means in series circuit with said source of switching voltage and said junction for controlling the slope of the reverse base current produced in said junction such that said reverse base current flows during the entire time interval required for said collector current to fall to zero during switching, thus establishing the optimum switching time for said transistor.

References Cited

UNITED STATES PATENTS

| | | | |
|---|---|---|---|
| 2,933,642 | 4/1960 | Marley | 307—300 |
| 2,963,592 | 12/1960 | De Graff | 307—300 |
| 3,081,437 | 3/1963 | Radcliffe | 307—300 |

DONALD D. FORRER, Primary Examiner

B. P. DAVIS, Assistant Examiner

U.S. Cl. X.R.

307—248, 254